(12) United States Patent
Hong et al.

(10) Patent No.: US 8,674,209 B2
(45) Date of Patent: Mar. 18, 2014

(54) THIN FILM TYPE SOLAR CELL AND METHOD FOR MANUFACTURING THE SAME

(75) Inventors: Jin Hong, Yongin-si (KR); Chang Sil Yang, Suwon-si (KR); Gi Chung Kwon, Gwangju-si (KR)

(73) Assignee: Jusung Engineering Co., Ltd., Gwangju-Si (KR)

( * ) Notice: Subject to any disclaimer, the term of this patent is extended or adjusted under 35 U.S.C. 154(b) by 503 days.

(21) Appl. No.: 12/809,581

(22) PCT Filed: Dec. 19, 2008

(86) PCT No.: PCT/KR2008/007554
§ 371 (c)(1),
(2), (4) Date: Jun. 19, 2010

(87) PCT Pub. No.: WO2009/082137
PCT Pub. Date: Jul. 2, 2009

(65) Prior Publication Data
US 2010/0288329 A1 Nov. 18, 2010

(30) Foreign Application Priority Data

Dec. 21, 2007 (KR) .................. 10-2007-0134980
Oct. 2, 2008 (KR) .................. 10-2008-0097209

(51) Int. Cl.
*H01L 31/042* (2006.01)
*H01L 31/00* (2006.01)
*H02N 6/00* (2006.01)

(52) U.S. Cl.
USPC .................. 136/244; 136/256; 136/258

(58) Field of Classification Search
USPC .................................... 136/244
See application file for complete search history.

(56) References Cited

U.S. PATENT DOCUMENTS

| 4,094,703 | A | * | 6/1978 | Williams | 136/254 |
| 4,322,571 | A | * | 3/1982 | Stanbery | 136/255 |
| 4,492,181 | A | * | 1/1985 | Ovshinsky et al. | 118/718 |

(Continued)

FOREIGN PATENT DOCUMENTS

| CN | 1826699 A | 8/2006 |
| CN | 1961430 A | 5/2007 |

(Continued)

OTHER PUBLICATIONS

Kiyoo Saito; "Method and Device for Forming Thin Film Pattern"; Patent Abstracts of Japan; Publication No. 2002-126659; Publication Date: May 8, 2002; Japan Patent Office, Japan.

(Continued)

*Primary Examiner* — Alicia Bland
*Assistant Examiner* — Uyen Tran
(74) *Attorney, Agent, or Firm* — Murabito, Hao & Barnes LLP; Andrew D. Fortney

(57) ABSTRACT

A thin film type solar cell and a method for manufacturing the same is disclosed, which is capable of improving solar-ray transmittance and dispersion efficiency by the increased effective area for absorbing the solar ray through the use of substrate with a predetermined pattern having protrusions and depressions, wherein the method comprises preparing a substrate with a predetermined pattern having protrusions and depressions on its one surface; forming a front electrode on the substrate; forming a semiconductor layer on the front electrode; and forming a rear electrode on the semiconductor layer.

21 Claims, 7 Drawing Sheets

(56) References Cited

U.S. PATENT DOCUMENTS

| | | | |
|---|---|---|---|
| 4,755,475 A * | 7/1988 | Kiyama et al. | 438/80 |
| 5,225,039 A * | 7/1993 | Ohguri | 216/24 |
| 5,981,866 A * | 11/1999 | Edelson | 136/256 |
| 6,265,652 B1 * | 7/2001 | Kurata et al. | 136/244 |
| 6,372,327 B1 * | 4/2002 | Burnham et al. | 428/156 |
| 6,822,158 B2 | 11/2004 | Ouchida et al. | |
| 6,946,029 B2 * | 9/2005 | Tsukuda et al. | 117/16 |
| 7,847,186 B2 | 12/2010 | Sawada et al. | |
| 2002/0191916 A1 * | 12/2002 | Frish et al. | 385/43 |
| 2004/0038616 A1 | 2/2004 | Toyoda et al. | |
| 2006/0174935 A1 | 8/2006 | Sawada et al. | |
| 2007/0264488 A1 | 11/2007 | Lee | |
| 2009/0038682 A1 | 2/2009 | Komatsu et al. | |

FOREIGN PATENT DOCUMENTS

| | | |
|---|---|---|
| EP | 0 991 129 A1 | 4/2000 |
| EP | 1 237 166 A2 | 9/2002 |
| JP | 2002-126659 A | 5/2002 |
| KR | 10-2006-0100108 A | 9/2006 |
| KR | 10-2007-0118896 A | 12/2007 |
| WO | 2005/011002 A1 | 2/2005 |
| WO | 2009/082137 A3 | 7/2009 |

OTHER PUBLICATIONS

Bum Sung Kim, She Won Ahn, Young Joo Eo and Neon Min Lee; "Thin Film Solar Cell Capable of Controlling Intensity of Incident Light and a Manufacturing Method of the Same Capable of Reducing a Manufacturing Cost by Simplifying a Manufacturing Method"; Korean Patent Abstracts; Publication No. 1020070118896 A; Publication Date: Dec. 18, 2007; Korean Intellectual Property Office, Republic of Korea.

Keong Su Lim, Seong Won Kwon, Joong Hwan Kwak, Sang Il Park, Jun Bo Yoon and Gun Woo Moon; "Method for Processing Transparent Electrode for Integrated Thin Film Solar Cell Capable of Minimizing Loss of Effective Area of Solar Cell, Structure Thereof and Transparent Substrate with Transparent Electrode"; Korean Patent Abstracts; Publication No. 1020060100108 A; Publication Date: Sep. 20, 2006; Korean Intellectual Property Office, Republic of Korea.

Toru Sawada, Yohei Koi, Toshiaki Sasaki, Masashi Yoshimi, Masahiro Goto and Kenji Yamamoto; "Silicon Based Thin Film Solar Cell"; Publication No. WO2005011002 (A1); Publication Date: Mar. 2, 2005; World Intellectual Property Organization, International Bureau.

PCT International Search Report; PCT International Application No. PCT/KR2008/007554; Dated Aug. 14, 2009; 3 pages; International Searching Authority/Korean Intellectual Property Office, Daejeon, Republic of Korea.

Chinese Office Action dated Sep. 1, 2011; Chinese Patent Application No. 200880120969.5; 5 pages; State Intellectual Property Office of P.R.C., People's Republic of China.

Toru Sawada, Yohei Koi, Toshiaki Sasaki, Masashi Yoshimi, Masahiro Goto and Kenji Yamamoto; "Silicon Based Thin Film Solar Cell"; Espacenet; Chinese Publication No. CN 1826699 (A); Publication Date: Aug. 30, 2006; Espacenet Database—Worldwide; http://worldwide.espacenet.com/.

Yuji Komatsu, Hiroyuki Fukumura, Yoshiroh Takaba, Ryoh Ozaki and Tohru Nunoi; "Semiconductor Substrate for Solar Cell, Method for Manufacturing the Same, and Solar Cell"; Espacenet; Chinese Publication No. CN 1961430 (A); Publication Date: May 9, 2007; Espacenet Database—Worldwide; http://worldwide.espacenet.com/.

Taiwanese Office Action dated Jun. 18, 2012; Taiwan Patent Application No. TW097149883; 6 pgs.; Taiwan Intellectual Property Office (TIPO), Taipei, Taiwan, R.O.C.

* cited by examiner

THIN FILM TYPE SOLAR CELL AND METHOD FOR MANUFACTURING THE SAME

TECHNICAL FIELD

The present invention relates to a thin film type solar cell, and more particularly, to a thin film type solar cell with high efficiency through the use of substrate having high solar-ray transmittance and dispersion ratios.

BACKGROUND ART

A solar cell with a property of semiconductor converts a light energy into an electric energy.

A structure and principle of the solar cell according to the related art will be briefly explained as follows. The solar cell is formed in a PN-junction structure where a positive(P)-type semiconductor makes a junction with a negative(N)-type semiconductor. When a solar ray is incident on the solar cell with the PN-junction structure, holes(+) and electrons(−) are generated in the semiconductor owing to the energy of the solar ray. By an electric field generated in an PN-junction area, the holes(+) are drifted toward the P-type semiconductor, and the electrons(−) are drifted toward the N-type semiconductor, whereby an electric power is produced with an occurrence of electric potential.

The solar cell can be largely classified into a wafer type solar cell and a thin film type solar cell.

The wafer type solar cell uses a wafer made of a semiconductor material such as silicon. In the meantime, the thin film type solar cell is manufactured by forming a semiconductor in type of a thin film on a glass substrate.

With respect to efficiency, the wafer type solar cell is better than the thin film type solar cell. However, in the case of the wafer type solar cell, it is difficult to realize a small thickness due to difficulty in performance of the manufacturing process. In addition, the wafer type solar cell uses a high-priced semiconductor substrate, whereby its manufacturing cost is increased.

Even though the thin film type solar cell is inferior in efficiency to the wafer type solar cell, the thin film type solar cell has advantages such as realization of thin profile and use of low-priced material. Accordingly, the thin film type solar cell is suitable for a mass production.

The thin film type solar cell is manufactured by sequential steps of forming a front electrode on a glass substrate, forming a semiconductor layer on the front electrode, and forming a rear electrode on the semiconductor layer.

Hereinafter, a related art thin film type solar cell will be explained with reference to the accompanying drawings.

FIG. 1 is a cross section view illustrating a related art thin film type solar cell.

As shown in FIG. 1, the related art thin film type solar cell includes a substrate 10, a front electrode 20 on the substrate 10, a semiconductor layer 30 on the front electrode 20, and a rear electrode 50 on the semiconductor layer 30.

The front electrode 20 forms a positive(+) electrode of the thin film type solar cell. Also, the front electrode 20 is made of a transparent conductive material since the front electrode 20 corresponds to a solar ray incidence face.

The semiconductor layer 30 is made of a semiconductor material, for example, silicon. The semiconductor layer 30 is formed in a PIN structure with a P(positive)-type silicon layer, an I(intrinsic)-type silicon layer, and an N(negative)-type silicon layer deposited in sequence.

The rear electrode 50 forms a negative(−) electrode of the thin film type solar cell. The rear electrode 50 is made of a conductive metal material, for example, aluminum.

Generally, the related art thin film type solar cell uses the substrate 10 made of glass. However, if manufacturing the thin film type solar cell with the glass substrate 100, a direction of solar ray incident on the substrate 10 is not very different from a direction of solar ray entering the front electrode 20 through the substrate 10. Thus, it is difficult to improve the efficiency of solar cell due to the limit in collection of the solar ray.

DISCLOSURE

Technical Problem

Therefore, the present invention has been made in view of the above problems, and it is an object of the present invention to provide a thin film type solar cell with high efficiency through the use of substrate having high solar-ray transmittance and dispersion ratios.

Technical Solution

To achieve these objects and other advantages and in accordance with the purpose of the invention, as embodied and broadly described herein, a method for manufacturing a thin film type solar cell comprises preparing a substrate with a predetermined pattern having protrusions and depressions on its one surface; forming a front electrode on the substrate; forming a semiconductor layer on the front electrode; and forming a rear electrode on the semiconductor layer.

In another aspect of the present invention, a method for manufacturing a thin film type solar cell comprises preparing a substrate with patterned and unpatterned regions on its one surface, wherein the patterned region has an uneven surface with a predetermined pattern having protrusions and depressions, and the unpatterned region has an even surface without the predetermined pattern having protrusions and depressions; forming a plurality of front electrodes at fixed intervals by a first separating portion interposed therebetween; forming a plurality of semiconductor layers at fixed intervals on the front electrode by a contact portion interposed therebetween; and forming a plurality of rear electrodes at fixed intervals by a second separating portion interposed therebetween, and connected with the front electrode through the contact portion.

The step for forming the plurality of front electrodes comprises forming a front electrode layer on the substrate; and forming the first separating portion by removing a predetermined region from the front electrode layer, wherein the first separating portion is positioned in the unpatterned region of the substrate.

The step for forming the plurality of semiconductor layers comprises forming a semiconductor layer on the front electrode; and forming the contact portion by removing a predetermined region from the semiconductor layer, wherein the contact portion is positioned in the unpatterned region of the substrate.

The step for forming the plurality of rear electrodes comprises forming a rear electrode layer on the semiconductor layer; and forming a second separating portion by removing a predetermined region from the rear electrode layer, wherein the second separating portion is positioned in the unpatterned region of the substrate.

At this time, the patterned region alternates with the unpatterned region.

In addition, the method comprises cleaning the substrate between the steps for preparing the substrate and forming the front electrode.

Also, the step for cleaning the substrate comprises performing a dry-cleaning procedure in an apparatus for forming the front electrode.

Furthermore, the method comprises forming a transparent conductive layer between the semiconductor layer and the rear electrode.

The step for preparing the substrate comprises preparing a melted solution for the substrate of thin film type solar cell; and forming the substrate of thin film type solar cell by passing the prepared melted solution through a space between first and second rollers, wherein the first roller includes a predetermined patterning part having protrusions and depressions, so as to make the predetermined pattern on one surface of the substrate of the thin film type solar cell manufactured by passing through the first roller.

The step for preparing the substrate comprises preparing a melted solution for the substrate of thin film type solar cell; and forming the substrate of thin film type solar cell by passing the prepared melted solution through a space between first and second rollers, wherein the first roller includes a patterning part with a predetermined pattern having protrusions and depressions, and an unpatterning part without the predetermined pattern having protrusions and depressions, so as to make patterned and unpatterned regions on one surface of the substrate of the thin film type solar cell manufactured by passing through the first roller.

The step for preparing the substrate comprises preparing a substrate whose both surfaces are even; forming a photoresist layer on one surface of the substrate; positioning a predetermined mask above the photoresist layer, and irradiating rays thereto; forming a photoresist pattern by developing the photoresist layer irradiated with rays; etching one surface of the substrate under the condition that the photoresist pattern is used as a mask; and removing the photoresist pattern.

The step for etching one surface of the substrate is performed in a dry-etching method, a wet-etching method, or an sand blasting method.

In another aspect of the present invention, a thin film type solar cell comprises a substrate including a predetermined pattern having protrusions and depressions; a front electrode on the substrate; a semiconductor layer on the front electrode; and a rear electrode on the semiconductor layer.

In another aspect of the present invention, a thin film type solar cell comprises a substrate including a patterned region with a predetermined pattern having protrusions and depressions, and an unpatterned region without the predetermined pattern having protrusions and depressions; a plurality of front electrodes provided on the substrate at fixed intervals by a first separating portion interposed therebetween; a plurality of semiconductor layers provided on the front electrode at fixed intervals by a contact portion interposed therebetween; and a plurality of rear electrodes provided at fixed intervals by a second separating portion interposed therebetween, and connected with the front electrode through the contact portion.

At least one of the first separating portion, the contact portion, and the second separating portion is formed at the portion corresponding to the unpatterned region.

The patterned region alternates with the unpatterned region.

In addition, a front conductive layer is additionally formed between the semiconductor layer and the rear electrode.

Advantageous Effects

The thin film type solar cell according to the present invention and the method for manufacturing the same has the following advantages.

First, the thin film type solar cell is manufactured through the use of substrate with the predetermined pattern having protrusions and depressions. Thus, the increased effective area for absorbing the solar ray enables the improved solar-ray transmittance and dispersion efficiency.

And, after cleaning the substrate with the predetermined pattern having protrusions and depressions, the front electrode is formed on the clean substrate with the predetermined pattern, so that it is possible to prevent the increase of resistance caused by the defective deposition of front electrode. Especially, since the procedure for cleaning the substrate is performed within the apparatus for forming the front electrode, it enables the consecutive performance of procedures without using the additional cleaning apparatus.

When manufacturing the thin film type solar cell provided with the plurality of unit cells, the first separating portion, the contact portion, and the second separating portion are formed in the unpatterned region of the substrate. Thus, the first separating portion, the contact portion, and the second separating portion can be positioned at the precise points since there is no refraction of laser beam in the unpatterned region.

BEST MODE

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film type solar cell according to the present invention and a method for manufacturing the same will be described with reference to the accompanying drawings.

<Method for Manufacturing Thin Film Type Solar Cell>

FIGS. 2A to 2D are cross section views illustrating a method for manufacturing a thin film type solar cell according to one embodiment of the present invention.

Figure 1:
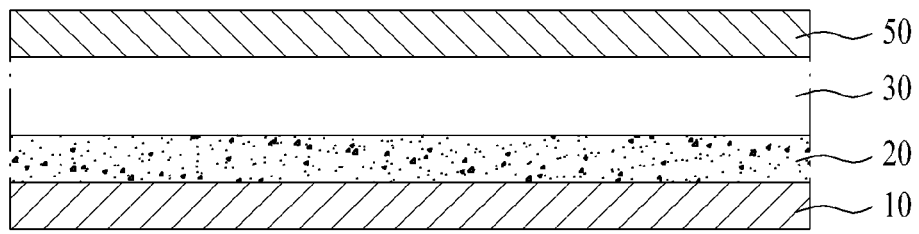
FIG. 1 is a cross section view illustrating a related art thin film type solar cell.
Figure 2:
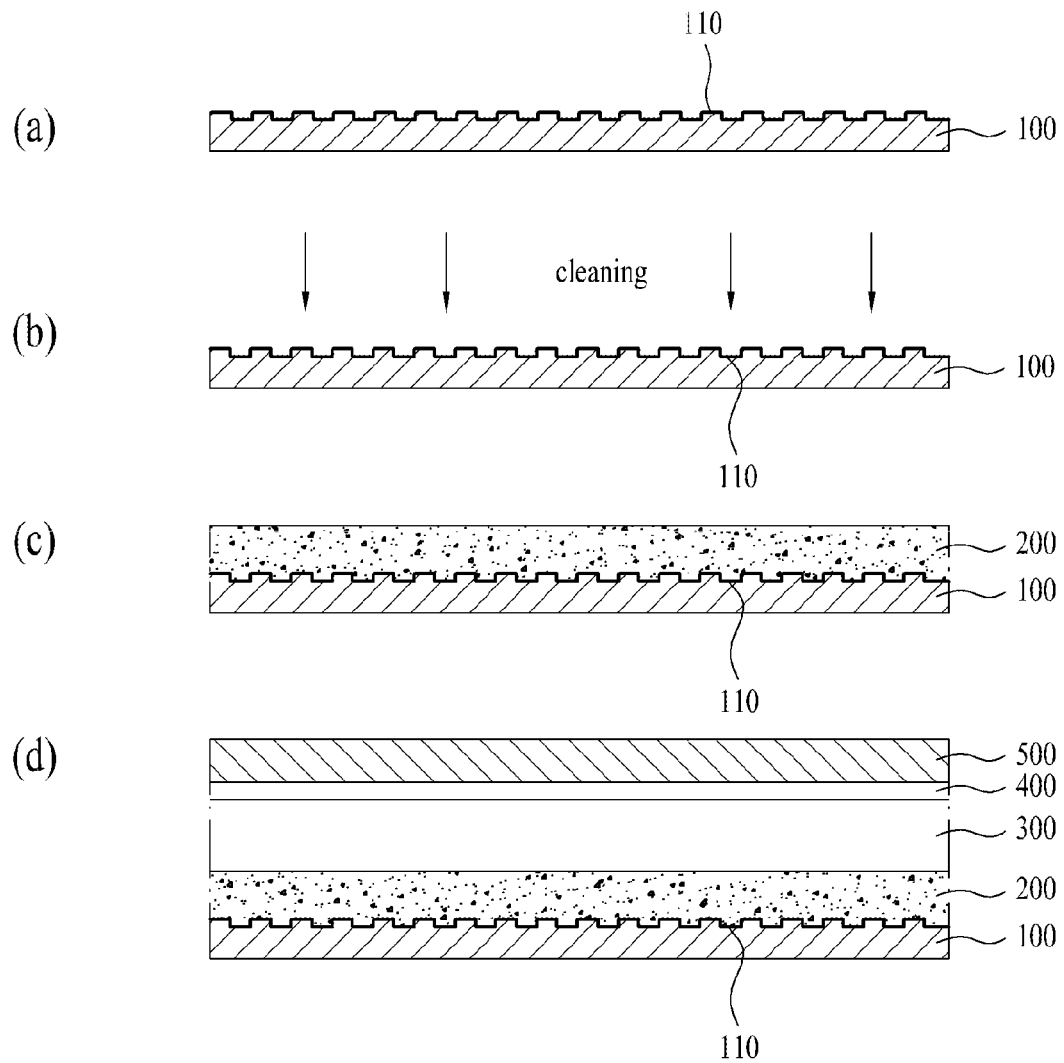
FIGS. 2A to 2D are cross section views illustrating a method for manufacturing a thin film type solar cell according to one embodiment of the present invention.

First, as shown in FIG. 2A, a substrate 100 is prepared, whose one surface is provided with a predetermined pattern 110 having protrusions and depressions.

Figure 4:
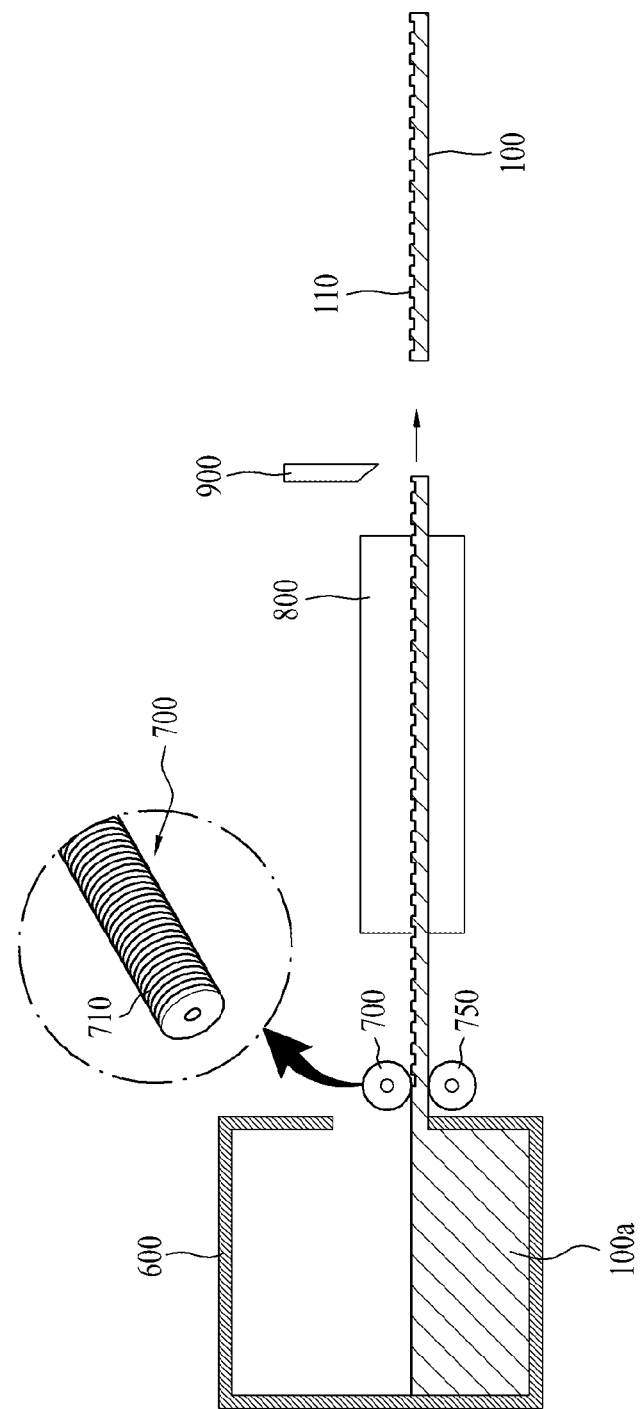
FIG. 4 is a schematic view illustrating an apparatus and method for manufacturing a substrate of a thin film type solar cell according to one embodiment of the present invention.

The substrate 100 with the predetermined pattern 110 having protrusions and depressions on its one surface can be prepared by the procedure of FIG. 4.

FIG. 4 is a schematic view illustrating an apparatus and method for manufacturing the substrate of the thin film type solar cell according to one embodiment of the present invention. As shown in FIG. 4, the apparatus for manufacturing the substrate of the thin film type solar cell according to one embodiment of the present invention includes a furnace 600, a first roller 700, a second roller 750, a cooler 800, and a cutter 900.

The furnace 600 contains a melted solution 100a for the substrate 100, wherein an opening is formed in one side of the furnace 600. The first and second rollers 700 and 750 being opposite to each other are provided in the external adjacent to the opening of the furnace 600. In this case, the first roller 700 has an uneven surface with a predetermined patterning part 710 having protrusions and depressions, and the second roller 750 has an even surface. The cooler 800 is disposed behind the first and second rollers 700 and 750, and the cutter 900 is disposed behind the cooler 800.

The procedure for preparing the substrate of the thin film type solar cell through the use of apparatus will be explained as follows.

First, the melted solution 100a for the substrate 100 is prepared in the furnace 600. Then, after the prepared solution 100a passes through the first and second rollers 700 and 750, the solution 100a is cooled by the cooler 800. Thus, the solution 100a is hardened, and is then cut according to a predetermined size, thereby forming the substrate 100. At this time, one surface of the substrate 100 is provided with the predetermined pattern 110 having protrusions and depressions based on the predetermined patterning part 710 of the first roller 700.

The substrate 100 with the predetermined pattern 110 having protrusions and depressions on its one surface can be prepared by the procedure of FIGS. 5A to 5F.

Figure 5:
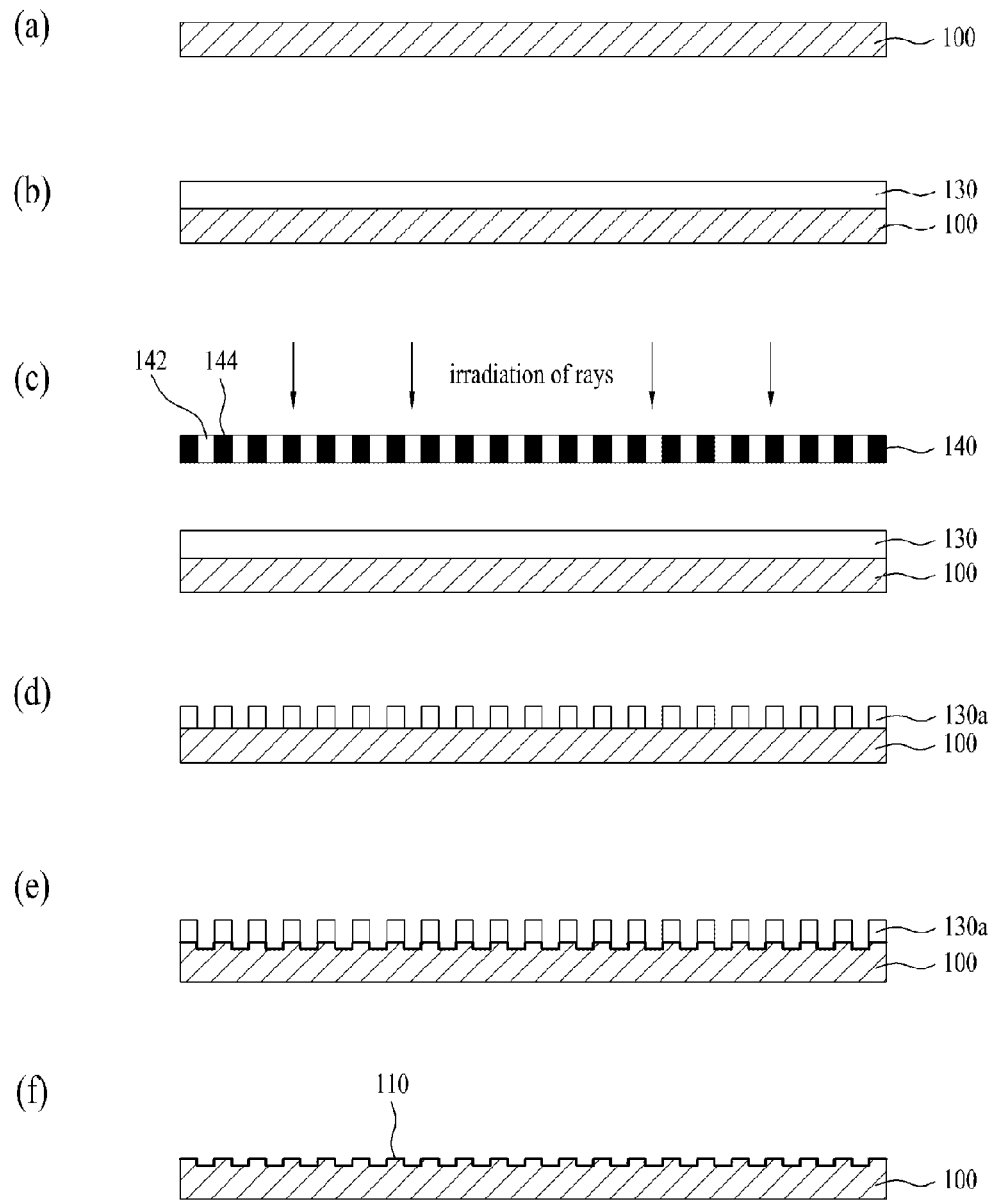
FIGS. 5A to 5F are cross section views illustrating a method for manufacturing a substrate of a thin film type solar cell according to another embodiment of the present invention.

As shown in FIG. 5A, the substrate 100 whose both surfaces are even is prepared. The substrate 100 whose both surfaces are even can be prepared by applying roller with the even surface instead of the first roller 700 with the surface of the predetermined patterning part 710 in the apparatus as shown in FIG. 4.

As shown in FIG. 5B, a photoresist layer 130 is formed on one surface of the substrate 100.

As shown in FIG. 5C, after disposing a predetermined mask 140 above the photoresist layer 130, rays are applied to the photoresist layer 130 through the predetermined mask 140. The mask 140 includes a first region 142 corresponding to a light-transmitting region, and a second region 144 corresponding to a light-shielding region. The first and second regions 142 and 144 are arranged appropriately in consideration to the predetermined pattern 110 having protrusions and depressions in the complete substrate 100.

As shown in FIG. 5D, a photoresist pattern 130a is formed by developing the photoresist layer 130 irradiated with the rays. FIG. 5D illustrates the case that the photoresist pattern 130a is completed by removing predetermined portions irradiated with the rays from the photoresist layer 130. However, predetermined portions which are not irradiated with the rays may be removed from the photoresist layer 130, according to the kind of material for the photoresist layer 130.

As shown in FIG. 5E, using the photoreist pattern 130a as a mask, one surface of the substrate 100 is etched in a dry-etching method, a wet-etching method, or a sand blasting method.

As shown in FIG. 5F, the substrate 100 whose one surface is provided with the predetermined pattern 110 having protrusions and depressions is completed by removing the photoresist pattern 130a.

Thereafter, as shown in FIG. 2B, the substrate 100 is cleaned.

As known in the procedure of FIG. 2C, a front electrode 200 is formed on the substrate 100. If the front electrode 200 is formed on the unclean substrate 100 with the predetermined pattern 110 having protrusions and depressions manufactured by the aforementioned procedure of FIG. 2A, it may causes the defective deposition of the front electrode 200, thereby increasing resistance in the thin film type solar cell.

Virtually, if the front electrode 200 is directly formed on the unclean substrate 100 manufactured by the procedure of FIG. 2A without cleaning the substrate 100 (wherein the front electrode 200 is made of ZnO at a thickness of 1 μm), a resistance value is within a range of 15Ω to 540Ω. However, if the front electrode 200 is formed on the clean substrate 100 after cleaning the substrate 100 manufactured by the procedure of FIG. 2A (wherein the front electrode 200 is made of ZnO at a thickness of 1 μm), it is possible to largely decrease a resistance value, within a range of 4.7Ω to 5Ω.

The procedure for cleaning the substrate 100 may be performed in an additional cleaning apparatus. This may cause a disadvantage of increased manufacturing cost. In this respect, it is preferable that the procedure for cleaning the substrate 100 be performed in the apparatus for forming the front electrode 200 in the procedure of FIG. 2C. In more detail, after an apparatus for RPSC (Remote Plasma Source Cleaning) is provided in an apparatus for MOCVD (Metal Organic Chemical Vapor Deposition), a dry-cleaning method using RPSC is applied to the substrate 100. At this time, gas such as $SF_6$ or $NF_6$ is used as main gas, and gas such as $O_2$, Ar, or $N_2$ is used as supplementary gas. If performing the procedure for cleaning the substrate in the apparatus for forming the front electrode 200, it enables the consecutive performance of procedures without using the additional cleaning apparatus.

As shown in FIG. 2C, the front electrode 200 is formed on the substrate 100.

The front electrode 200 is formed of a transparent conductive material, for example, ZnO, ZnO:B, ZnO:Al, $SnO_2$, $SnO_2$:F, or ITO (Indium Tin Oxide) by sputtering or MOCVD (Metal Organic Chemical Vapor Deposition).

In order to transmit the solar ray into the inside of solar cell with the minimized loss, a texturing process may be additionally performed to the front electrode 200.

Through the texturing process, a surface of material layer is provided with an uneven surface, that is, a texture structure, by an etching process using photolithography, an anisotropic etching process using a chemical solution, or a mechanical scribing process. According as the texturing process is performed to the front electrode 200, a solar-ray reflection ratio on the solar cell is decreased and a solar-ray absorbing ratio on the solar cell is increased owing to a dispersion of the solar ray, thereby improving the solar cell efficiency.

As shown in FIG. 2D, a semiconductor layer 300, a transparent conductive layer 400, and a rear electrode 500 are sequentially formed on the front electrode 200.

The semiconductor layer 300 is made of a silicon-based semiconductor material by a plasma CVD method. The semiconductor layer 300 may be formed in a PIN structure by sequentially depositing a P-type semiconductor layer, an I-type semiconductor layer, and an N-type semiconductor layer. In the semiconductor layer 300 with the PIN structure, depletion is generated in the I-type semiconductor layer by the P-type semiconductor layer and the N-type semiconductor layer, whereby an electric field occurs. Thus, electrons and holes generated by the solar ray are drifted by the electric field, and the drifted electrons and holes are collected in the N-type semiconductor layer and the P-type semiconductor layer, respectively. If forming the semiconductor layer 300 with the PIN structure, the P-type semiconductor layer is positioned on the front electrode 200, and the I-type and N-type semiconductor layers are formed on the P-type semiconductor layer, preferably. This is because a drift mobility of the hole is less than a drift mobility of the electron. In order to maximize the collection efficiency by the incident ray, the P-type semiconductor layer is positioned adjacent to the solar ray incidence face.

The transparent conductive layer 400 may be formed of a transparent conductive material, for example, ZnO, ZnO:B, ZnO:Al, or Ag by sputtering or MOCVD (Metal Organic Chemical Vapor Deposition). It is possible to omit the transparent conductive layer 400. However, it is preferable that the transparent conductive layer 400 be provided so as to improve the efficiency of solar cell. That is, when forming the transparent conductive layer 400, the solar ray passes through the semiconductor layer 300, and then passes through the transparent conductive layer 400. In this case, the solar ray passing through the transparent conductive layer 400 is dispersed at different angles. Thus, after the solar ray is reflected on the rear electrode 500, the solar ray re-incidence ratio is increased on the semiconductor layer 300.

The rear electrode 500 may be formed of a metal material, for example, Ag, Al, Ag+Mo, Ag+Ni, or Ag+Cu by sputtering or printing.

The substrate 100 provided with the predetermined pattern 110 having protrusions and depressions according to the present invention enables the increased effective area for absorbing the solar ray, thereby resulting in the improved solar-ray transmission and dispersion ratios.

As shown in experimental results, if the front electrode 200 of ZnO is deposited at a thickness of 1 μm on the general glass substrate, the solar-ray transmittance and dispersions ratios are 83.9% and 1.8%, respectively. Meanwhile, if the front electrode 200 of ZnO is deposited at a thickness of 1 μm on the substrate 100 with the predetermined pattern 110 having protrusions and depressions according to the present invention, the solar-ray transmittance and dispersions ratios are 87.2% and 79.9%, respectively, that is, the solar-ray dispersion ratio is largely improved.

FIGS. 3A to 3H are cross section views illustrating a method for manufacturing a thin film type solar cell according to another embodiment of the present invention, wherein the thin film type solar cell according to another embodiment of the present invention is provided with a plurality of unit cells connected in series. The detailed explanation for the same parts as those in the aforementioned embodiment of the present invention will be omitted.

Figure 3:
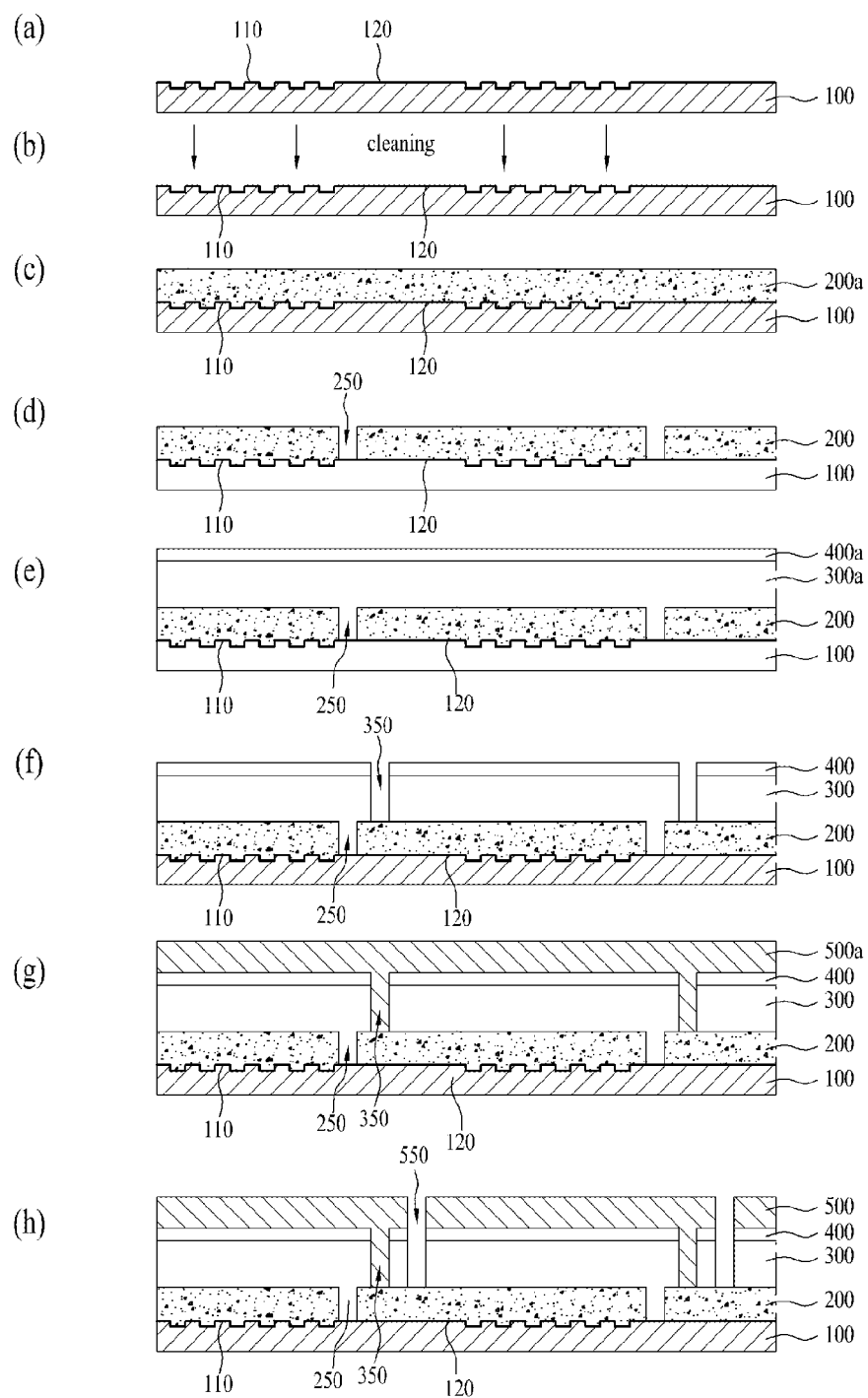
FIGS. 3A to 3H are cross section views illustrating a method for manufacturing a thin film type solar cell according to another embodiment of the present invention.

First, as shown in FIG. 3A, a substrate 100 is prepared, whose one surface includes a patterned region 110 with a predetermined pattern having protrusions and depressions, and an unpatterned region 120 without the predetermined pattern having protrusions and depressions. The patterned region 110 alternates with the unpatterned region 120.

Figure 6:
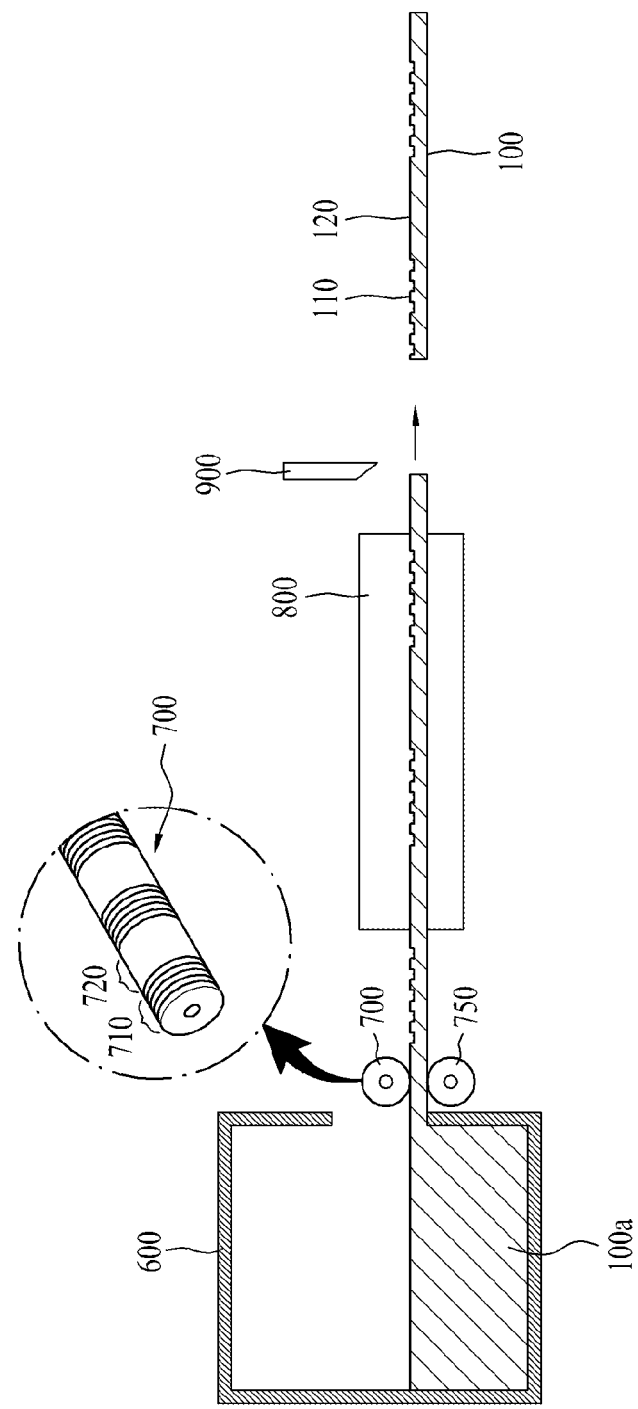
FIG. 6 is a schematic view illustrating an apparatus and method for manufacturing a substrate of a thin film type solar cell according to another embodiment of the present invention.

The substrate 100 with both the patterned region 110 and the unpatterned region 120 on its one surface is prepared by the procedure of FIG. 6.

FIG. 6 is a schematic view illustrating an apparatus and method for manufacturing the substrate of the thin film type solar cell according to another embodiment of the present invention. Except structures of first roller 700 and substrate 100, the apparatus and method of FIG. 6 are identical to those of FIG. 4.

As shown in FIG. 6, the first roller 700 includes a patterning part 710 with a predetermined pattern having protrusions and depressions, and an unpatterning part 720 without the predetermined pattern having protrusions and depressions. According as the first roller 700 rolls on one surface of the substrate 100 of the thin film type solar cell, the patterned region 110 with the predetermined pattern having protrusions and depressions, and the unpatterned region 120 without the predetermined pattern having protrusions and depressions are formed in one surface of the substrate 100.

The substrate 100 provided with the patterned region 110 with the predetermined pattern and the unpatterned region 120 without the predetermined pattern on its one surface can be prepared by the procedure of FIGS. 5A to 5F (however, a pattern of mask 140 should be changed for the procedure of FIG. 5C). That is, the substrate 100 provided with the patterned region 110 with the predetermined pattern, and the unpatterned region 120 without the predetermined pattern on its one surface can be obtained by properly changing the first region 142 corresponding to a light-transmitting region and the second region 144 corresponding to a light-shielding region in the mask 140 as shown in FIG. 5C.

Next, as shown in FIG. 3B, the substrate 100 is cleaned.

The procedure for cleaning the substrate 100 may be performed in an additional cleaning apparatus. After an apparatus for RPSC (Remote Plasma Source Cleaning) is provided in an apparatus for MOCVD (Metal Organic Chemical Vapor Deposition) used for forming a front electrode layer 200a in the procedure of FIG. 3C, a dry-cleaning method using RPSC is applied to the substrate 100.

As shown in FIG. 3C, the front electrode layer 200a is formed on the substrate 100.

As shown in FIG. 3D, a first separating portion 250 is formed by removing a predetermined region from the front electrode layer 200a. Thus, the plurality of front electrodes 200 are formed at fixed intervals by the first separating portion 250 interposed between each of the front electrodes 200.

The procedure for forming the first separating portion 250 may be performed by a laser-scribing method using laser beam. If the laser beam is irradiated to the predetermined region with the predetermined pattern having protrusions and depressions, the laser beam is refracted so that the first separating portion 250 can not be formed in the predetermined region. Thus, the laser beam has to be irradiated to the region without the predetermined pattern having protrusions and depressions. For this, the first separating portion 250 is formed in the unpatterned region 120 without the predetermined pattern having protrusions and depressions on the substrate 100.

As shown in FIG. 3E, a semiconductor layer 300a and a transparent conductive layer 400a are sequentially formed on the front electrode 200.

As shown in FIG. 3F, a contact portion 350 is formed by removing predetermined regions of the semiconductor layer 300a and transparent conductive layer 400a. Thus, the plurality of semiconductor layers 300 and transparent conductive layers 400 are formed at fixed intervals by the contact portion 350 interposed between each of the semiconductor layers 300 and transparent conductive layers 400.

The procedure for forming the contact portion 350 may be performed by a laser-scribing method using laser beam. Due to the same reason as that for the procedure of FIG. 3D, it is preferable that the contact portion 350 be formed in the unpatterned region 120 of the substrate 100.

As shown in FIG. 3G, a rear electrode layer 500a is formed while being connected with the front electrode 200 through the contact portion 350.

As shown in FIG. 3H, a second separating portion 550 is formed by removing the predetermined region from the rear electrode layer 500a. Thus, the plurality of rear electrodes 500 are formed at fixed intervals by the second separating portion 550 interposed between each of the rear electrodes 500.

The procedure for forming the second separating portion 550 may be performed by a laser-scribing method using laser beam. Due to the same reason as that for the procedure of FIG. 3D, it is preferable that the second separating portion 550 be formed in the unpatterned region 120 of the substrate 100.

<Thin Film Type Solar Cell>

Figure 7:
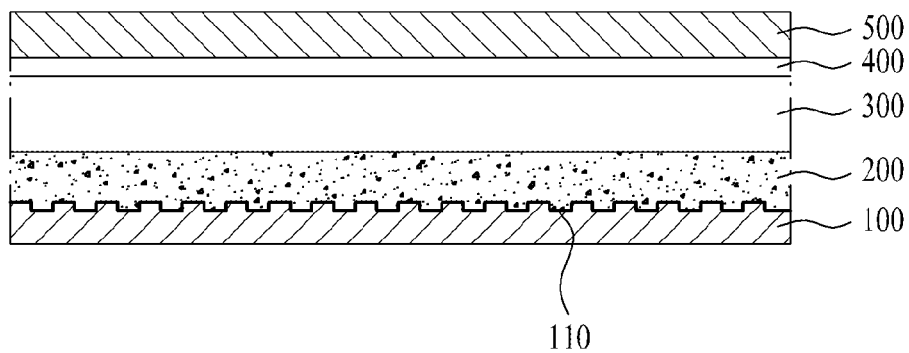
FIG. 7 is a cross section view illustrating a thin film type solar cell according to one embodiment of the present invention.

FIG. 7 is a cross section view illustrating a thin film type solar cell according to one embodiment of the present invention, which can be manufactured by the method explained with reference to FIGS. 2A to 2D, and the detailed explanation for the respective parts will be omitted.

As shown in FIG. 7, the thin film type solar cell according to one embodiment of the present invention includes a substrate 100, a front electrode 200, a semiconductor layer 300, a transparent conductive layer 400, and a rear electrode 500.

The substrate 100 is provided with a predetermined pattern 110 having protrusions and depressions. The front electrode 200 is formed on the substrate 100, wherein the front electrode 200 functions as a positive(+) electrode of the thin film type solar cell. In order to improve the efficiency in absorption of solar ray, the surface of front electrode 200 may be uneven according to the predetermined pattern 110 having protrusions and depressions.

The semiconductor layer 300 is formed on the front electrode 200, and the semiconductor layer 300 is formed of a silicon-based semiconductor material in a PIN structure. The transparent conductive layer 400 is formed on the semiconductor layer 300, which can be omitted. The rear electrode 500 is formed on the transparent conductive layer 400, which functions as a negative(−) electrode of the thin film type solar cell.

Figure 8:
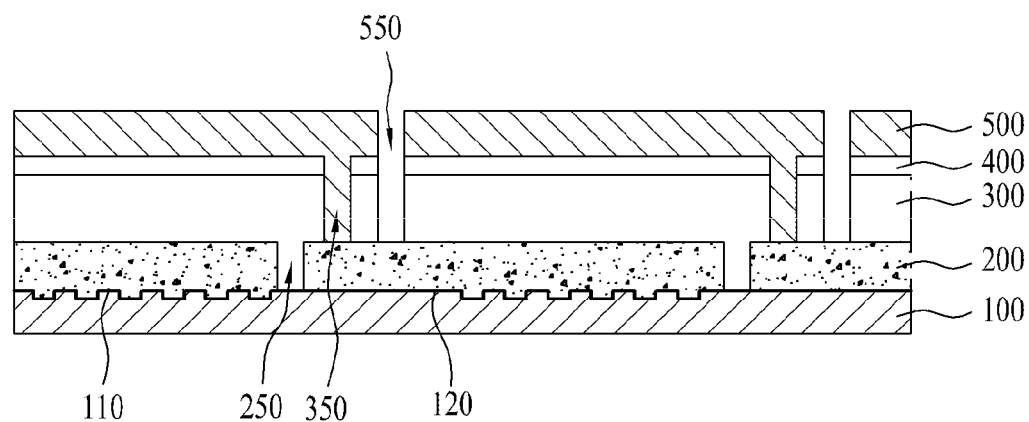
FIG. 8 is a cross section view illustrating a thin film type solar cell according to another embodiment of the present invention.

FIG. 8 is a cross section view illustrating a thin film type solar cell according to another embodiment of the present invention, which can be manufactured by the method explained with reference to FIGS. 3A to 3H, and the detailed explanation for the respective parts will be omitted.

As shown in FIG. 8, the thin film type solar cell according to another embodiment of the present invention includes a substrate 100, a front electrode 200, a semiconductor layer 300, a transparent conductive layer 400, and a rear electrode 500.

The substrate 100 is provided with a patterned region 110 with a predetermined pattern having protrusions and depressions, and an unpatterned region 120 without the predetermined pattern having protrusions and depressions. The patterned region 110 alternates with the unpatterned region 120.

The plurality of front electrodes 200 are formed at fixed intervals by the first separating portion 250 interposed between each of the front electrodes 200. At this time, the first separating portion 250 is formed in the unpatterned region 120 of the substrate 100.

The plurality of semiconductor layers 300 and the transparent conductive layers 400 are formed at fixed intervals by the contact portion 350 between each of the semiconductor layers 300 and transparent conductive layers 400. At this time, the contact portion 350 is formed in the unpatterned region 120 of the substrate 100.

The rear electrode 500 is connected with the front electrode 200 through the contact portion 350, and the plurality of rear electrodes 500 are formed at fixed intervals by the second separating portion 550 interposed between each of the rear electrodes 500. At this time, the second separating portion 550 is formed in the unpatterned region 120 of the substrate 100.

The thin film type solar cell of FIG. 7 may be manufactured by the method explained with reference to FIGS. 2A to 2D, but not limited to this method, and the thin film type solar cell of FIG. 8 may be manufactured by the method explained with reference to FIGS. 3A to 3H, but not limited to this method.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method for manufacturing a thin film type solar cell comprising:

preparing a substrate with patterned and unpatterned regions on a surface thereof, wherein each of the patterned regions comprises a predetermined pattern of protrusions and depressions, and the unpatterned regions have an even surface;

forming a plurality of front electrodes at fixed intervals with a first separating portion between adjacent front electrodes;

forming a plurality of semiconductor layers at fixed intervals on the front electrode with a contact portion therebetween, wherein one continuous portion of each of the plurality of semiconductor layers is directly over an entire predetermined pattern of protrusions and depressions in a corresponding one of the patterned regions of the substrate, and the contact portion is in one of the unpatterned regions of the substrate; and forming a plurality of rear electrodes at fixed intervals by a second separating portion therebetween, and connected with the front electrode through the contact portion, wherein each of the plurality of rear electrodes is directly over the entire predetermined pattern of protrusions and depressions in the corresponding one of the patterned regions of the substrate, and the second separating portion is in one of the unpatterned regions of the substrate;

wherein forming the plurality of front electrodes comprises:

forming a front electrode layer on the substrate; and forming the first separating portion by removing a predetermined region from the front electrode layer, wherein the first separating portion is in one of the unpatterned regions of the substrate, and each of the front electrodes is directly over the entire predetermined pattern of protrusions and depressions in the corresponding one of the patterned regions of the substrate.

2. The method according to claim 1, wherein forming the plurality of semiconductor layers comprises:
   forming a semiconductor layer on the front electrodes; and
   forming the contact portion by removing a predetermined region from the semiconductor layer from one of the unpatterned regions of the substrate.

3. The method according to claim 1, wherein forming the plurality of rear electrodes comprises:
   forming a rear electrode layer on the semiconductor layer; and
   forming the second separating portions by removing a predetermined region from the rear electrode layer in each of the unpatterned regions of the substrate.

4. The method according to claim 1, wherein the patterned regions alternate with the unpatterned regions.

5. The method according to claim 1, further comprising cleaning the substrate before forming the front electrodes.

6. The method according to claim 5, wherein cleaning the substrate comprises performing a dry-cleaning procedure in an apparatus that forms the front electrodes.

7. The method according to claim 1, further comprising forming a transparent conductive layer before forming the rear electrodes.

8. The method according to claim 1, wherein preparing the substrate comprises:
   preparing a melted solution; and
   forming the substrate by passing the melted solution through a space between first and second rollers,
   wherein the first roller includes a patterning part having protrusions and depressions complementary to the predetermined pattern of protrusions and depressions, and an unpatterning part without the complementary protrusions and depressions, so as to make the patterned and unpatterned regions on the surface of the substrate.

9. The method according to claim 1, wherein preparing the substrate comprises:
   preparing a substrate having opposite surfaces that are even;
   forming a photoresist layer on one of the opposite surfaces of the substrate;
   positioning a mask above the photoresist layer, and irradiating the photoresist layer through the mask;
   forming a photoresist pattern by developing the irradiated photoresist layer;
   etching one surface of the substrate using the photoresist pattern as a mask; and
   removing the photoresist pattern.

10. The method according to claim 9, wherein etching the one surface of the substrate comprises a dry-etching method, a wet-etching method, or a sand blasting method.

11. The method according to claim 1, wherein said plurality of front electrodes comprises a transparent conductive material selected from the group consisting of ZnO, ZnO:B, ZnO:Al, $SnO_2$, $SnO_2$:F, and ITO (Indium Tin Oxide), and the method further comprises performing a texturing process on a surface of the transparent conductive material.

12. The method according to claim 1, wherein said plurality of rear electrodes comprises a conductive metal material selected from the group consisting of Ag, Al, Ag+Mo, Ag+Ni, and Ag+Cu.

13. The method according to claim 1, comprising forming a plurality of first separating portions.

14. The method according to claim 13, wherein each first separating portion is between adjacent front electrodes.

15. The method according to claim 13, wherein each first separating portion is in a corresponding unpatterned region.

16. The method according to claim 1, comprising forming a plurality of contact portions by removing predetermined regions from the semiconductor layers.

17. The method according to claim 16, wherein forming the plurality of contact portions further comprises removing a predetermined region from a transparent conductive layer.

18. The method according to claim 16, wherein each contact portion is in a corresponding unpatterned region.

19. The method according to claim 1, comprising forming a plurality of second separating portions.

20. The method according to claim 19, wherein each second separating portion is between adjacent rear electrodes.

21. The method according to claim 19, wherein each second separating portion is in a corresponding unpatterned region of the substrate.

* * * * *